United States Patent
Chen et al.

(10) Patent No.: US 12,209,105 B2
(45) Date of Patent: Jan. 28, 2025

(54) VAPOR DEPOSITION PRECURSOR COMPOUNDS AND PROCESS OF USE

(71) Applicant: ENTEGRIS, INC., Billerica, MA (US)

(72) Inventors: Philip S. H. Chen, Bethel, CT (US); Eric Condo, Shelton, CT (US); Bryan C. Hendrix, Danbury, CT (US); Thomas H. Baum, New Fairfield, CT (US); David Kuiper, Brookfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 100 days.

(21) Appl. No.: 17/901,569

(22) Filed: Sep. 1, 2022

(65) Prior Publication Data
US 2023/0041086 A1 Feb. 9, 2023

Related U.S. Application Data

(62) Division of application No. 16/899,060, filed on Jun. 11, 2020, now Pat. No. 11,466,038.

(51) Int. Cl.

| | | |
|---|---|---|
| C07F 7/10 | (2006.01) | |
| C01B 21/082 | (2006.01) | |
| C07F 7/08 | (2006.01) | |
| C07F 7/18 | (2006.01) | |
| C23C 16/30 | (2006.01) | |
| C23C 16/36 | (2006.01) | |
| C23C 16/455 | (2006.01) | |
| H01L 21/02 | (2006.01) | |

(52) U.S. Cl.
CPC ............ *C07F 7/10* (2013.01); *C01B 21/0828* (2013.01); *C07F 7/0814* (2013.01); *C07F 7/1804* (2013.01); *C23C 16/308* (2013.01); *C23C 16/36* (2013.01); *C23C 16/45536* (2013.01); *C23C 16/45553* (2013.01); *H01L 21/0214* (2013.01); *H01L 21/02211* (2013.01); *H01L 21/02274* (2013.01); *H01L 21/0228* (2013.01)

(58) Field of Classification Search
None
See application file for complete search history.

(56) References Cited

U.S. PATENT DOCUMENTS

| | | | |
|---|---|---|---|
| 2,730,532 A | 1/1956 | Martin | |
| 7,022,864 B2 * | 4/2006 | Borovik | C07F 7/1804 106/287.16 |
| 9,102,693 B2 | 8/2015 | Wang | |
| 11,466,038 B2 * | 10/2022 | Chen | C01B 21/0828 |
| 2005/0013936 A1 | 1/2005 | Borovik | |
| 2005/0215072 A1 * | 9/2005 | Kevwitch | H01L 21/02063 438/778 |
| 2007/0087025 A1 * | 4/2007 | Fitzhugh | A61L 31/16 427/2.26 |
| 2008/0048148 A1 | 2/2008 | Borovik | |
| 2011/0206857 A1 | 8/2011 | Yim | |
| 2012/0321791 A1 | 12/2012 | Suzuki | |
| 2016/0225615 A1 | 8/2016 | Hunks | |
| 2017/0140925 A1 | 5/2017 | Suzuki | |
| 2017/0186603 A1 * | 6/2017 | Moon | H01L 21/02214 |
| 2017/0323775 A1 * | 11/2017 | Saly | H01L 21/02126 |
| 2019/0185377 A1 * | 6/2019 | Cakmak | C04B 18/146 |

FOREIGN PATENT DOCUMENTS

| | | | |
|---|---|---|---|
| CN | 101723963 A | 6/2010 | |
| EP | 2767535 B1 | 8/2016 | |
| WO | WO-2019032457 A1 * | 2/2019 | ............. C23C 16/36 |

OTHER PUBLICATIONS

M. Karg et al., 29 Chemistry of Materials, 4920-4931 (2017) (Year: 2017).*
J. Park et al., ACS Applied Materials & Interfaces (2016) (Year: 2016).*
R. Ovanesyan et al., 37 J. Vac. Sci. Technol. A 37, 060904 (2019) (Year: 2019).*
J. Lee et al. Characteristics of low-κ SiOC films deposited via atomic layer deposition; Thin Solid Film, vol. 645, (2018) p. 334-339 (abstract only).
Verdonck, P.; et al The Influence of N Containing Plasma on Low K films Microelectronic Engineering (2011), 88(5), 627-630. (abstract only).

* cited by examiner

*Primary Examiner* — Alexander R Pagano (57) ABSTRACT

Provided is a plasma enhanced atomic layer deposition (PEALD) process for depositing etch-resistant SiOCN films. These films provide improved growth rate, improved step coverage and excellent etch resistance to wet etchants and post-deposition plasma treatments containing $O_2$ and $NH_3$ co-reactants. This PEALD process relies on one or more precursors reacting in tandem with the plasma exposure to deposit the etch-resistant thin-films of SiOCN. The films display excellent resistance to wet etching with dilute aqueous HF solutions, both after deposition and after post-deposition plasma treatment(s). Accordingly, these films are expected to display excellent stability towards post-deposition fabrication steps utilized during device manufacturing and build.

12 Claims, 3 Drawing Sheets

VAPOR DEPOSITION PRECURSOR COMPOUNDS AND PROCESS OF USE

TECHNICAL FIELD

In general, the invention relates to materials and processes for depositing thin films of silicon oxycarbonitride onto microelectronic device surfaces. These films serve as low dielectric constant insulators with excellent wet and dry etching resistance.

BACKGROUND

Silicon nitride (SiN) has been used for source and drain spacer (S/D spacer) for FinFET and gate-all-around (GAA) structures due to its high wet etch and $O_2$ ashing resistance. Unfortunately, SiN has a high dielectric constant (k) of about 7.5. Carbon and nitrogen doped $SiO_2$ (SiCON) spacer has been developed to reduce the dielectric constant and maintain excellent etch and ashing resistance. Currently, the best etch and ashing resistant SiCON dielectrics have a k value of around 4.0. Etch and ashing resistant dielectrics with a k value of <3.5 are needed for next generation devices.

Additionally, there remains a need for improved organosilicon precursors for formation of silicon-containing films in the manufacture of microelectronic devices, particularly in processes utilizing low temperature vapor deposition techniques utilized for the formation of silicon oxycarbonitride (SiOCN) films. In particular, there is a need for liquid silicon precursors with good thermal stability, high volatility, and reactivity with a substrate surface.

Increasing device performance requires new materials to enhance the ability to isolate both transistors and interconnect circuits. These films often require low dielectric constant properties (i.e., <4), while also enduring subsequent processing steps during the device fabrication, including wet-etch and dry-etch resistance. Further, the deposited insulators must not change when exposed to post-deposition processing. When these films are deposited in the front-end-of line, the films must conformally coat 3D structures, as found in in FinFET devices, while demonstrating uniform dielectric properties over the entire structure. Since the film remains in the device, electrical performance cannot change with post-deposition processing. Plasma-based deposition processes often result in films with non-uniform electrical properties, wherein the top of the film is altered by enhanced plasma bombardment. Concurrently, the sidewalls of the 3D structure, coated with the same film, may display different properties, a result of reduced electron bombardment during deposition. Nonetheless, the film must withstand wet-etching and/or post-plasma processing in oxidizing or reducing environments.

SUMMARY

The invention provides a plasma enhanced atomic layer deposition (PEALD) process to deposit etch resistant SiOCN films. These films provide improved growth rate, improved step coverage and excellent etch resistance to wet etchants and post-deposition plasma treatments containing $O_2$ and $NH_3$ co-reactants. This PEALD process relies on one or more precursors reacting in tandem with the plasma exposure to deposit the etch-resistant thin-films of SiOCN. The films display excellent resistance to wet etching with dilute aqueous HF solutions, both after deposition and after post-deposition plasma treatment(s). Accordingly, these films are expected to display excellent stability towards post-deposition fabrication steps utilized during device manufacturing and build.

BRIEF DESCRIPTION OF THE DRAWINGS

The disclosure may be more completely understood in consideration of the following description of various illustrative embodiments in connection with the accompanying drawings

While the disclosure is amenable to various modifications and alternative forms, specifics thereof have been shown by way of example in the figures and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1, 1.5, 2, 2.75, 3, 3.80, 4 and 5).

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

In a first aspect, the invention provides a process for the vapor deposition of a silicon oxycarbonitride film onto a microelectronic device surface in a reaction zone, which comprises sequentially introducing into said reaction zone reactants chosen from (i) at least one silylamine, (ii) at least one oxiranyl silane, wherein (i) and (ii) are introduced in either order, and (iii) a reducing gas in plasma form, with purging of each reactant prior to exposing the film to the next reactant. In this aspect, the pulse sequence of such reactants may either be:

a. silylamine; purge; oxiranyl silane; purge; reducing gas in plasma form; purge; or
b. oxiranylsilane; purge; silylamine; purge; reducing gas in plasma form; purge. In one embodiment, the reactants are devoid of halogen atoms.

As used herein, the term "silicon oxycarbonitride" film refers to films containing varying proportions of silicon, oxygen, carbon, and nitrogen. In one embodiment, the invention provides a film having from about
  (i) 30 to 50 atomic percentage of silicon;
  (ii) 5 to 30 atomic percentage of nitrogen;
  (iii) 2 to 25 atomic percentage of carbon; and
  (iv) 20 to 40 atomic percentage of oxygen.

In another embodiment, the invention provides a film having about
  (i) 25 to 45 atomic percentage of silicon;
  (ii) 10 to 25 atomic percentage of nitrogen;
  (iii) 5 to 20 atomic percentage of carbon; and
  (iv) 25 to 35 atomic percentage of oxygen.

In certain embodiments, the silicon oxycarbonitride (SiCON) films of the invention have about 15 to about 25 atomic percentage of nitrogen and in other embodiments, about 8 to about 12 atomic percentage of carbon

In one embodiment, the term "silylamine" refers to compounds having one or two silyl groups and at least one secondary amine moiety. Examples of such silylamines include:

(I)

(II)

(III)

In one embodiment, the term "oxiranyl silane" refers to a silicon compound having at least one epoxy ring attached thereto, either directly or through an alkyl or alkyloxy linking group. Examples of such compounds include (IV)

(V)

(VI)

(VII)

compounds of the formula:

(VIII)

wherein each R is independently chosen from $C_1$-$C_4$ alkyl, and x is zero or 1; and compounds of the formula (IX)

wherein each $R^1$ is independently chosen from a $C_1$-$C_4$ alkyl group or a group of the formula wherein each R³ is independently chosen from hydrogen or $C_1$-$C_4$ alkyl; and wherein each R² is independently chosen from hydrogen or $C_1$-$C_4$ alkyl.

In the above formulas (VIII) and (X), when x is zero, this structure will be understood to depict an oxiranyl silane compound where no divalent oxygen atom is present; in other words, when x is zero, the structure will depict a silicon-silicon covalent bond.

Further, examples of $C_1$-$C_4$ alkyl include methyl, ethyl, propyl, isopropyl, n-butyl, isobutyl, sec-butyl, and t-butyl. In one embodiment, the $C_1$-$C_4$ alkyl is methyl.

In one embodiment, in the above formula (VIII), each R¹ is methyl; in another embodiment, each R¹ is a group of the formula In a second aspect, the invention provides a process for depositing a silicon oxycarbonitride film on a microelectronic device surface in a reaction zone under atomic layer deposition conditions, which comprises sequentially introducing into said reaction zone:

a. a silylamine chosen from:

b. followed by purging said reaction zone with an inert gas;

c. followed by introducing into said reaction zone an oxiranyl silane chosen from compounds of the formula:

(VII)

wherein each R is independently chosen from $C_1$-$C_4$ alkyl, and x is zero or 1; and
compounds of the formula (IX)

wherein each $R^1$ is independently chosen from a $C_1$-$C_4$ alkyl group or a group of the formula (X)

wherein each $R^3$ is independently chosen from hydrogen or $C_1$-$C_4$ alkyl; and (XI)

wherein each $R^2$ is independently chosen from hydrogen or $C_1$-$C_4$ alkyl.
d. followed by purging said reaction zone with an inert gas;
e. followed by introducing into said reaction zone to a reducing gas in plasma form;
f. followed by purging said reaction zone with an inert gas; and repeating steps a. through f. until a film of a desired thickness has been deposited.

In a third aspect, the invention provides a process for depositing a silicon oxycarbonitride film on a microelectronic device surface in a reaction zone under atomic layer deposition conditions, which comprises sequentially introducing into said reaction zone:

a. an oxiranyl silane chosen from (IV)

(V)

(VI)

(VII)

compounds of the formula:

(VIII)

wherein each R is independently chosen from $C_1$-$C_4$ alkyl, and x is zero or 1; and compounds of the formula (IX)

wherein each $R^1$ is independently chosen from a $C_1$-$C_4$ alkyl group or a group of the formula (X)

wherein each $R^3$ is independently chosen from hydrogen or $C_1$-$C_4$ alkyl; and (XI)

wherein each $R^2$ is independently chosen from hydrogen or $C_1$-$C_4$ alkyl;
b. followed by purging said reaction zone with an inert gas;
c. followed by introducing into said reaction zone a silylamine chosen from:

(I)

(II)

(III)

d. followed by purging said reaction zone with an inert gas;
e. followed by introducing into said reaction zone a reducing gas in plasma form;
f. followed by purging said reaction zone with an inert gas; and repeating steps a. through f. until a film of a desired thickness has been deposited.

In a fourth aspect, the invention provides a compound of the formula wherein each R is methyl.

In a fifth aspect, the invention provides compounds of the formula (XI)

wherein
(i) each $R^2$ is a group of the formula or
(ii) wherein one $R^2$ is hydrogen and the other $R^2$ is a group of the formula The compounds of the fourth and fifth aspects are useful as precursors in the vapor deposition of silicon to form silicon-containing films.

In general, the silylamines of the invention can be prepared from the corresponding halogenated silyl compound and the appropriate amine. See, for example, U.S. Pat. No. 7,022,864 incorporated herein by reference.

In general, the compounds of formulas (VIII) and (X) can be prepared according to the following reaction scheme shown for the synthesis of compounds of formula (VIII):

In general, the compounds of formula (VIII), wherein x is zero, can be prepared by reacting a chlorosilane with 1,2-epoxy-3-propanol in the presence of triethylamine to afford the corresponding silyl ether.

Synthesis of the compounds of formulas IV, V, and VI can be prepared according to the procedure described by Borovik et. al. in Borovik, A.; Xu, C.; Baum, T.; Bilodeau, S.; Roeder, J.; Ebbing, A.; Vestyck, D. Ethyleneoxide-Silane and Bridged Silane Precursors for Forming Low K Films. (See also U.S. Pat. No. 7,022,864 incorporated herein by reference.) Synthesis of compounds of the formula VI and other glycidoxysilyl esters of the formula VIII can be performed as detailed in Martin, R. W. Epoxy-Substituted Esters of Silicon Acids and Their Preparation. (See also U.S. Pat. No. 2,730,532, incorporated herein by reference.) Synthesis silylamines and aminodisilanes of formulas (I), (II), and (III) can be prepared by methods described by Wang, Z.; Xu, C.; Hendrix, B.; Roeder, J.; Chen, T.; Baum, T. H. "Composition and Method for Low Temperature Chemical Vapor Deposition of Silicon-Containing Films Including Silicon Carbonitride and Silicon Oxycarbonitride Films", U.S. Pat. No. 9,102,693, incorporated herein by reference.

Compounds of formula (XI) can be prepared according to the following scheme:

In one embodiment, the vapor deposition conditions comprise a temperature of about 250° C. to about 400° C., and a pressure of about 1 to about 20 Torr, or about 1 to 10 Torr. In another embodiment, the vapor deposition conditions comprise a temperature of about 300° to about 350° C.

The compounds above can be employed for forming high-purity thin silicon-containing films by any suitable ALD technique, and pulsed plasma processes. Such vapor deposition processes can be utilized to form silicon-containing films on microelectronic devices by utilizing deposition temperatures of from about 350° to about 550° C. to form films having a thickness of from about 20 angstroms to about 200 angstroms.

The process of the invention, the compounds above may be reacted with the desired microelectronic device substrate in any suitable manner, for example, in a single wafer chamber, or in a furnace containing multiple wafers.

Alternately, the process of the invention can be conducted as an ALD-like process. As used herein, the terms "ALD or ALD-like" refers to processes where each reactant is introduced sequentially into a reactor such as a single wafer ALD reactor, semi-batch ALD reactor, or batch furnace ALD reactor, or each reactant is exposed to the substrate or microelectronic device surface by moving or rotating the substrate to different sections of the reactor and each section is separated by an inert gas curtain, i.e., spatial ALD reactor or roll to roll ALD reactor.

In one embodiment, the invention relates to a plasma enhanced atomic layer deposition process (PEALD) for depositing silicon oxycarbonitride films using the silyl amines and oxiranyl silanes as described herein, together with a reducing gas in plasma form. Nitrogen plasma may be useful for the formation of films having higher nitrogen atomic percentages while utilizing silyl amines and oxiranyl silanes and reducing gas in plasma form as taught herein.

As used herein, the term "reducing gas in plasma form", means the reducing gas in plasma form is comprised of gases chosen from hydrogen ($H_2$), hydrazine ($N_2H_4$); $C_1$-$C_4$ alkyl hydrazines, such as methyl hydrazine, t-butyl hydrazine, 1,1-dimethylhydrazine, and 1,2-dimethylhydrazine, which are utilized in combination with a plasma formed from an inert gas, such as $N_2$, He or Ar alone or in combination with $H_2$. For example, a continuous flow of inert gas such as argon is utilized while an $R_f$ field is initiated, followed by initiation of hydrogen to provide the plasma $H_2$. Typically, the plasma power utilized ranges from about 50 to 500 Watts at 13.6 Hz.

In certain embodiments, the pulse time (i.e., duration of exposure to the substrate) for the reactants depicted above (i.e., the silylamines, the oxiranyl silanes, and reducing gas in plasma form) ranges between about 1 and 10 seconds. When a purge step is utilized, the duration is from about 1 to 10 seconds or 2 to 5 seconds. In other embodiments, the pulse time for each reactant ranges from about 2 to about 5 seconds.

The process disclosed herein involves one or more purge gases. The purge gas, which is used to purge away unconsumed reactants and/or reaction by-products, is an inert gas that does not react with the precursors. Exemplary purge gases include, but are not limited to, argon, nitrogen, helium, neon, hydrogen, and mixtures thereof. In certain embodiments, a purge gas such as Ar is supplied into the reactor at a flow rate ranging from about 10 to about 2000 sccm for about 0.1 to 1000 seconds, thereby purging the unreacted material and any by-product that may remain in the reactor.

The respective step of supplying the silylamine and oxiranyl silane compounds, reducing gas in plasma form, and/or other precursors, source gases, and/or reagents may be performed by changing the sequences for supplying them and/or changing the stoichiometric composition of the resulting dielectric film.

In the process of the invention, energy is applied to the various reactants to induce reaction and to form the silicon oxycarbonitride film on the microelectronic device substrate. Such energy can be provided by, but not limited to, thermal, pulsed thermal, plasma, pulsed plasma, high density plasma, inductively coupled plasma, remote plasma process, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated 'remotely' of the reaction zone and substrate, being supplied into the reactor.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. Such microelectronic devices contain at least one substrate, which can be chosen from, for example, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

Figure 1:
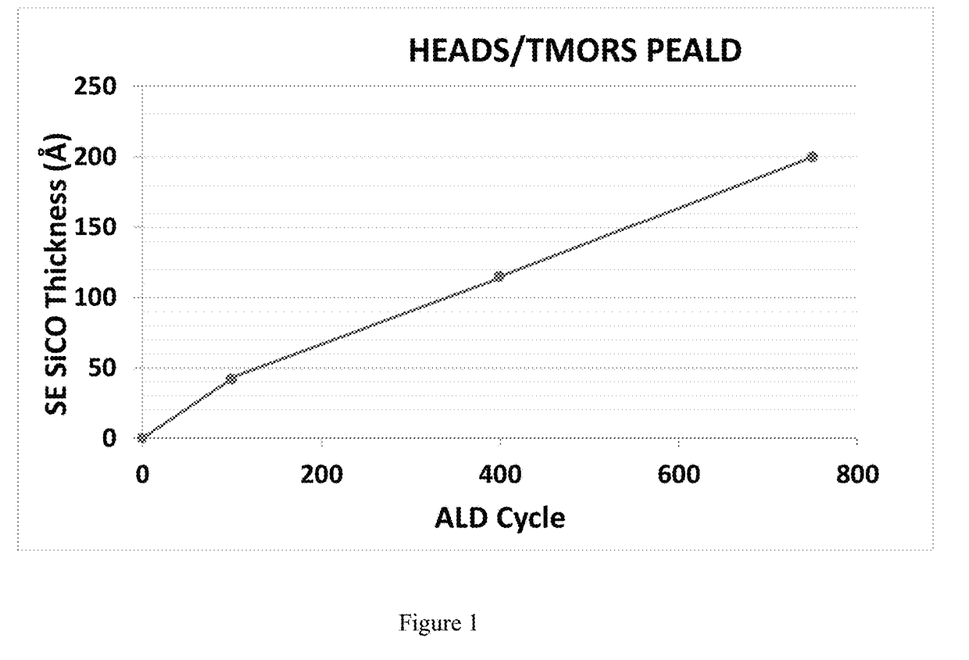
FIG. 1 shows the ALD growth rate for the deposition of a SiCON film from HEADS and TMORS.
Figure 2:
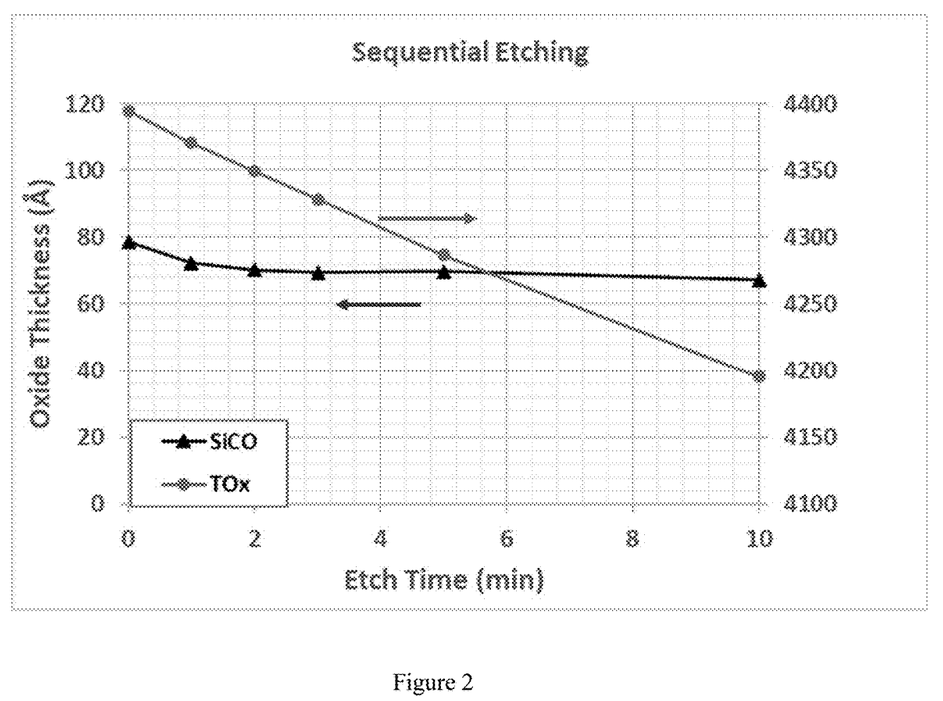
FIG. 2 depicts the measured wet etch rate for a film of SiOCN deposited from HEADS and DMDORS and thermal oxide (Tox) reference. The film was etched with 100:1 dilute aqueous HF as a function of time at room temperature.
Figure 3:
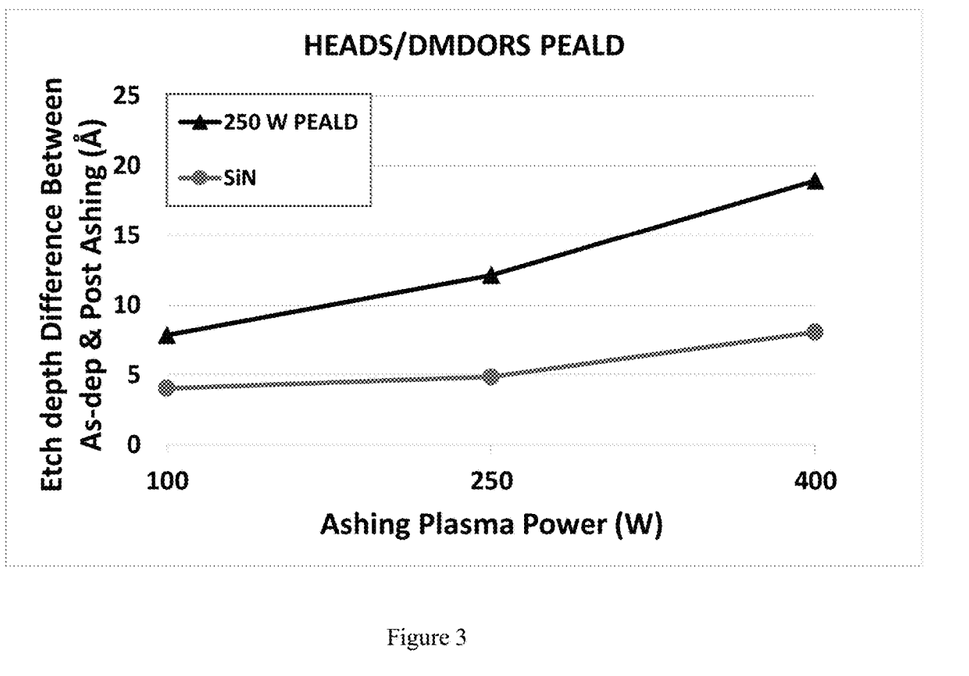
FIG. 3 depicts ashing resistance for a film of SiOCN deposited from HEADS and DMDORS, and a silicon nitride (SiN) reference. The ashing resistances were the measured wet etch rate (100:1 diluted HF for 60 seconds) differences before and after $O_2$ plasma exposure at 100 W, 250 W, and 400 W for 60 seconds.

These films provide low etch resistance to wet etchants and $O_2$ plasmas. $O_2$ plasma ashing processes were carried out at 340° C. and 3 Torr pressure for 1 minute with 500 sccm $O_2$ flow and plasma powers of 100, 250 and 400 W. In this regard, with reference to FIG. 3, the invention provides in another aspect a silicon oxycarbonitride film which exhibits an ashing damage difference of only about 4 angstroms over a silicon nitride reference sample when exposed to oxygen plasma at 100 Watts for 60 seconds. In another embodiment, the invention provides a microelectronic device having deposited thereon a silicon oxycarbonitride film which exhibits an ashing damage difference of only about 4 angstroms over a silicon nitride reference sample when exposed to oxygen plasma at 100 Watts for 60 seconds.

As noted above, in certain embodiments, the silicon oxycarbonitride (SiCON) films of the invention have about 15 to about 25 atomic percentage of nitrogen and about 12 atomic percentage of carbon. Utilizing the process of the invention such SiCON films having a dielectric constant (k) of less than about 3.5 can be prepared. In other embodiments, the dielectric constant of such SiCON films are about 2.5 to about 4.0.

In general, the desired thickness of the SiCON films thus prepared are about 20 Å to about 200 Å.

Doping of the low-k SiCO films with nitrogen, via the interaction between silylamine and oxiranyl silane precursors, and subsequent reaction with $H_2$ plasma, dramatically improves the wet etch & $O_2$ plasma ashing resistance of the resulting SiCON films.

In the process of the invention, the delivery rate of oxiranyl silane may be about 10 to 100 mg per PEALD cycle, and about 5 to 50 mg per PEALD cycle for silylamine.

This invention can be further illustrated by the following examples of certain embodiments thereof, although it will be understood that these examples are included merely for purposes of illustration and are not intended to limit the scope of the invention unless otherwise specifically indicated.

EXAMPLES

Example 1

Synthesis of Bis(Glycidoxy)Tetramethyldisilane
(VIII, where x=0 and R=$CH_3$)

A 100 mL round bottom flask was charged with triethylamine (3.21 g, 31.8 mmol) and (oxiran-2-yl)methanol (1.62 g, 21.7 mmol) and then diluted with hexane (20 mL). The vessel was fitted with a rubber septum and transferred out of the glovebox. A PTFE coated thermocouple was inserted through the septum and the cloudy solution was cooled to −11° C. with a brine bath. A solution of 1,2-dichloro-1,1,2,2-tetramethyldisilane (2.00 g, 10.6 mmol) in 10 mL anhydrous hexanes was added dropwise over 12 minutes via syringe. A slight exotherm was noted and a thick white precipitate was formed. The reaction mixture was allowed to stir for 2.5 hours at 0° C. and then warmed up to ambient temperature. The reaction mixture was filtered through a 10 micron filter and the resulting solution was stripped of solvent at 40 torr and ambient temperature. A thick colorless oil with precipitate resulted. The reaction mixture was kept under vacuum for 3 hours to allow complete removal of triethylamine. The residue was then taken up in minimal pentane and filtered through a 0.4 micron syringe filter. The pentane was then removed under vacuum (40 torr). The cloudy colorless oil was distilled under vacuum (0.100 to 0.200 torr) to give two fractions with a combined yield of 44% (95% pure mixture of diastereomers by $^1$H NMR). $^1$H NMR (C6D6): δ 3.87-3.71 (ddd, 2H), 3.61-3.45 (ddd, 2H), 3.02-2.96 (m, 2H), 2.67-2.64 (dd, 2H), 2.54-2.49 (dd, 2H), 0.15 (s, 12H), 0.06 (s, 12H).

The PEALD SiCON deposition was conducted using a modified ASM® PEALD system, with a susceptor temperature of 400° C., a showerhead temperature of 170° C., a chamber pressure of 3 Torr, and an ambient inert gas flow of 500 sccm. The coupon temperature during deposition was approximately 340° C.

Hydrogen plasma was created using a direct plasma system which creates a plasma between the showerhead and the susceptor/wafer. Plasma powers ranged from 150 to 500 W. Plasma pulse times ranged from 5 to 45 seconds.

The pulsing scheme for PEALD of SiCON consisted of the following:
1. Silylamine pulse (1-5 sec)
2. Inert gas purge (10 sec)
3. Oxiranyl silane or vinylsilane pulse (1-10 sec)
4. Inert gas purge (10 sec)
5. H$_2$ Plasma pulse (5-45 sec)
6. Inert gas purge (5-10 sec)

As can be seen from the data below, doping of nitrogen dramatically improves etch and ashing resistance of SiCON films, and made possible the achievement of dielectric constants of <3.5 in the SiCON films.

| XPS Depth profile composition | HEADS/ DEOMORS H$_2$/Ar PEALD, 5 s | HEADS/ TMORS H$_2$/Ar, PEALD, 30 s | HEADS/ DMDORS H$_2$/Ar PEALD, 15 s |
| --- | --- | --- | --- |
| Carbon* | 12.2 | 11.6 | 13.1 |
| Nitrogen* | 21.0 | 17.9 | 16.8 |
| Oxygen* | 29.9 | 31.2 | 31.5 |
| Silicon* | 36.8 | 39.3 | 38.5 |

*atomic percentage
Note:
HEADS precursor provides~15-25 atomic percentage nitrogen doping to the SiCON films.

| | HEADS/ DEOMORS H$_2$/Ar PEALD, | HEADS/ TMORS H$_2$/Ar, PEALD, | HEADS/ DMDORS H$_2$/Ar PEALD, |
| --- | --- | --- | --- |
| GPC (Å/cycle) | 0.19 | 0.24 | 0.24 |
| XPS Carbon (atomic %) | 12.2 | 11.6 | 13.1 |
| DHF WER (Å/minute) | 0.62 | 0.62 | 0.52 |
| Dielectric Constant (K) | <4 | <4 | <3.5 |
| Ashing Damage (Å/minute) 100 W plasma | 10.3 | 6.1 | 7.8 |

Legend:
HEADS = hexa(ethylamino)disilane
DMDORS = dimethyldioxiranylsilane
TMORS = trimethyloxiranylsilane
DEOMORS = diethoxymethyloxiranylsilane

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made in detail without exceeding the scope of the disclosure. The disclosure's scope is, of course, defined in the language in which the appended claims are expressed.

What is claimed is:

1. A process for the vapor deposition of a silicon oxycarbonitride film onto a microelectronic device surface in a reaction zone, which comprises sequentially introducing into said reaction zone reactants chosen from (i) at least one silylamine, (ii) at least one oxiranyl silane, wherein (i) and (ii) are introduced in either order, and (iii) a reducing gas in plasma form, with purging of each reactant prior to exposing the film to the next reactant, wherein the silylamine has two silicon atoms per molecule and the oxiranyl silane selected from:

(V)

(VI)

(VII)

compounds of the formula:

(VIII)

wherein each R is independently chosen from C$_1$-C$_4$ alkyl, and x is zero or 1;
compounds of the formula (IX)

wherein each R$^1$ is independently chosen from a C$_1$-C$_4$ alkyl group or a group of the formula (X)

wherein each R$^3$ is independently chosen from hydrogen or C$_1$-C$_4$ alkyl; and (XI)

wherein each R$^2$ is independently chosen from hydrogen or C$_1$-C$_4$ alkyl.

2. The process of claim 1, wherein the silicon oxycarbonitride film so formed exhibits an ashing damage difference of only about 4 angstroms over a silicon nitride reference sample when exposed to oxygen plasma at 100 Watts for 60 seconds.

3. The process of claim 1, wherein the silylamine is

4. The process of claim 1, wherein the oxiranyl silane is

5. The process of claim 1, wherein the oxiranyl silane is

6. The process of claim 1, wherein the oxiranyl silane is

7. The process of claim 1, wherein the oxiranyl silane is chosen from compounds of the formula:

wherein each R is independently chosen from C$_1$-C$_4$ alkyl, and x is zero or 1.

8. The process of claim 1, wherein the oxiranyl silane is chosen from compounds of the formula (IX)

wherein each $R^1$ is independently chosen from a $C_1$-$C_4$ alkyl group or a group of the formula 9. The process of claim 1, wherein the oxiranyl silane is chosen from (X)

wherein each $R^3$ is independently chosen from hydrogen or $C_1$-$C_4$ alkyl.

10. The process of claim 1, wherein the oxiranyl compound is chosen from (XI)

wherein each $R^2$ is independently chosen from hydrogen or $C_1$-$C_4$ alkyl.

11. A process for depositing a silicon oxycarbonitride film on a microelectronic device surface in a reaction zone under atomic layer deposition conditions, which comprises sequentially introducing into said reaction zone:

a. a silylamine chosen from:

(III)

b. followed by purging said reaction zone with an inert gas;
c. followed by introducing into said reaction zone an oxiranyl silane chosen from (V)

(VI)

(VII)

compounds of the formula:

(VIII)

wherein each R is independently chosen from $C_1$-$C_4$ alkyl, and x is zero or 1; and
compounds of the formula

(IX)

wherein each $R^1$ is independently chosen from a $C_1$-$C_4$ alkyl group or a group of the formula (X)

wherein each $R^3$ is independently chosen from hydrogen or $C_1$-$C_4$ alkyl; and (XI)

wherein each $R^2$ is independently chosen from hydrogen or $C_1$-$C_4$ alkyl;

d. followed by purging said reaction zone with an inert gas;
e. followed by introducing into said reaction zone a reducing gas in plasma form;
f. followed by purging said reaction zone with an inert gas; and
repeating steps a. through f. until a film of a desired thickness has been deposited.

12. A process for depositing a silicon oxycarbonitride film on a microelectronic device surface in a reaction zone under atomic layer deposition conditions, which comprises sequentially introducing into said reaction zone:

a. an oxiranyl silane chosen from (V)

(VI)

(VII)

compounds of the formula:

(VIII)

wherein each R is independently chosen from $C_1$-$C_4$ alkyl, and x is zero or 1; and compounds of the formula (IX)

wherein each $R^1$ is independently chosen from a $C_1$-$C_4$ alkyl group or a group of the formula (X)

wherein each $R^3$ is independently chosen from hydrogen or $C_1$-$C_4$ alkyl; and (XI)

wherein each $R^2$ is independently chosen from hydrogen or $C_1$-$C_4$ alkyl;

b. followed by purging said reaction zone with an inert gas;
c. followed by introducing into said reaction zone a silylamine chosen from:

(III)

d. followed by purging said reaction zone with an inert gas;
e. followed by introducing into said reaction zone a reducing gas in plasma form;
f. followed by purging said reaction zone with an inert gas; and repeating steps a. through f. until a film of a desired thickness has been deposited.

* * * * *